(12) United States Patent
Kawase

(10) Patent No.: US 6,815,886 B2
(45) Date of Patent: Nov. 9, 2004

(54) LIGHT EMITTING DEVICE COMPRISING A SUBSTRATE, A TRANSPARENT ELECTRODE, A LAYER OF LIGHT EMITTING MATERIAL AND A SECOND ELECTRODE AND A METHOD OF MANUFACTURING THE LIGHT EMITTING DEVICE

(75) Inventor: Takeo Kawase, Cambridge (GB)

(73) Assignees: Seiko Epson Corporation, Tokyo (JP); Cambridge University Technical Services Limited of the Old Schools, Cambridge (GB)

(*) Notice: Subject to any disclaimer, the term of this patent is extended or adjusted under 35 U.S.C. 154(b) by 282 days.

(21) Appl. No.: 09/832,795

(22) Filed: Apr. 12, 2001

(65) Prior Publication Data
US 2001/0033136 A1 Oct. 25, 2001

(30) Foreign Application Priority Data
Apr. 14, 2000 (GB) ............................................. 0009370

(51) Int. Cl.[7] .............................. H01J 1/62; H01J 63/04; H01L 33/00
(52) U.S. Cl. ....................... 313/506; 313/498; 313/504; 257/95; 257/98
(58) Field of Search ................................ 313/499, 504, 313/506; 257/95, 98

(56) References Cited

U.S. PATENT DOCUMENTS

| | | | | |
|---|---|---|---|---|
| 4,803,691 A | * | 2/1989 | Scifres et al. ................... | 372/50 |
| 5,663,573 A | * | 9/1997 | Epstein et al. ................. | 257/40 |
| 6,252,253 B1 | * | 6/2001 | Bao et al. ....................... | 257/89 |
| 6,433,487 B1 | * | 8/2002 | Yamazaki ................ | 315/169.3 |

FOREIGN PATENT DOCUMENTS

| | | |
|---|---|---|
| EP | 0 756 334 A2 | 1/1997 |
| JP | 61-212084 * | 9/1986 |
| JP | 10229243 | 8/1998 |
| WO | WO 97/01910 A1 | 11/1997 |
| WO | WO 97/42666 | 11/1997 |
| WO | WO 98/01910 A1 | 1/1998 |

OTHER PUBLICATIONS

B.J. Matterson et al., "Effect of Lateral Microstructure on Conjugated Polymer Luminescence", *Synthetic Metals*, 1999, 250–251.

Christian Kallinger et al., "A Flexible Conjugated Polymer Laser", *Wiley–Vch Verlag GmbH*, 1998, 920–923.

* cited by examiner

Primary Examiner—Nimeshkumar D. Patel
Assistant Examiner—Matt Hodges
(74) Attorney, Agent, or Firm—Oliff & Berridge PLC

(57) ABSTRACT

A light emitting device comprising a substrate, a transparent electrode formed on said substrate, a layer of light emitting material provided over the transparent electrode and having at least one corrugated surface, and a further electrode formed over the light emitting material. In a preferred arrangement there is provided a light emitting device comprising a substrate having a corrugated surface, a transparent electrode formed on said corrugated surface, a layer of light emitting material provided over the transparent electrode and a further electrode formed over the light emitting material. In another preferred arrangement there is provided a light emitting device comprising a substrate, a transparent electrode formed over the substrate, a conductive polymer layer formed over the transparent electrode and having a corrugated surface opposite to a surface facing the transparent electrode, a light emitting material in contact with said corrugated surface and a further electrode formed over the light emitting material. The invention also provides a method of manufacturing a light emitting device comprising the steps of providing a substrate, forming a transparent electrode on said substrate, providing a layer of light emitting material over the transparent electrode, arranging for the light emitting surface to have at least one corrugated surface, and forming a further electrode over the light emitting material. Very preferably the light emitting material is an organic material.

50 Claims, 7 Drawing Sheets a)

b)

c)

d)

a)

b)

c)

d)

a)

b)

c)

US 6,815,886 B2

LIGHT EMITTING DEVICE COMPRISING A SUBSTRATE, A TRANSPARENT ELECTRODE, A LAYER OF LIGHT EMITTING MATERIAL AND A SECOND ELECTRODE AND A METHOD OF MANUFACTURING THE LIGHT EMITTING DEVICE

BACKGROUND OF THE INVENTION

1. Field of Invention

The present invention relates to light emitting devices particularly those having a structure comprising a substrate, a transparent electrode, a layer of light emitting material and a second electrode.

2. Description of Related Art

In such light emitting devices, holes are injected into the light emitting material from one electrode (usually the transparent electrode) and electrons are injected from the other electrode. Electron-hole recombination in the light emitting, or active, material generates light. The generated light is emitted from the device through the transparent electrode.

SUMMARY OF THE INVENTION

An object of the present invention is to provide a light emitting device of the above mentioned type wherein the efficiency of the device is improved.

According to a first aspect of the present invention there is provided a light emitting device comprising a substrates a transparent electrode formed on said substrate, a layer of light emitting material provided over the transparent electrode and having at least one corrugated surface, and a further electrode formed over the light emitting material In a preferred arrangement there is provided a light emitting device comprising a substrate having a corrugated surface, a transparent electrode formed on said corrugated surface, a layer of light emitting material provided over the transparent electrode and a further electrode formed over the light emitting material.

In another preferred arrangement there is provided a light emitting device comprising a substrate, a transparent electrode formed over the substrate, a conductive polymer layer formed over the transparent electrode and having a corrugated surface opposite to a surface facing the transparent electrode, a light emitting material in contact with said corrugated surface and a further electrode formed over the light emitting material.

According to a second aspect of the present invention there is provided a method of manufacturing a light emitting device comprising the steps of providing a substrate, forming a transparent electrode on said substrate, providing a layer of light emitting material over the transparent electrode, arranging for the light emitting surface to have at least one corrugated surface, and forming a further electrode over the light emitting material.

In a preferred method the step of arranging for the light emitting surface to have at least one corrugated surface includes providing a corrugated surface on the substrate.

Another preferred method includes the step of forming a conductive polymer layer over the transparent electrode and in this method the step of arranging for the light emitting surface to have at least one corrugated surface includes providing a corrugated surface on the conductive polymer layer.

In the present invention, very preferably the light emitting material is an organic material.

It has been found that in the conventional devices, the layer of light emitting material acts as a waveguide and a substantial portion of the generated light can be trapped in waveguide modes within the active material. The higher the refractive index of the light emitting material, the larger the proportion of the generated light which is trapped in waveguide modes in the light emitting mate This consideration will thus be of particular significance with the use of organic materials for the light emitting layer, especially if conjugated polymers are used as the active material. This is because organic materials, especially conjugated polymers, have a high refractive index around the wavelength of the light omitted from the organic materials.

It is understood that proposals have been made for the use of corrugated surfaces within certain electronically pumped laser devices. However, such devices have a fundamentally different structure and mode of operation compared with the light emitting devices to which the present invention applies. Moreover, the previous proposals have been of a mainly theoretical nature and have postulated devices which would be extremely difficult, if not impossible, to fabricate in practice.

BRIEF DESCRIPTION OF THE DRAWINGS

Embodiments of the present invention will now be described by way of further example only and with reference to the accompanying drawings in which.

DETAILED DESCRIPTION OF PREFERRED EMBODIMENTS

The present invention provides light emitting devices in which the active layer has a corrugated surface. It is the effect of the corrugated active layer which enhances the efficiency of light emitting devices according to the present invention. The pitch of the corrugations, and to a lesser extent their amplitude, affects the performance of the device, as will be described below. There are, however, four areas of particular note with respect to practicable embodiments of the present invention. These are: the fabrication process, optical loss in the active layer, the pitch of the corrugations and the periodic structure of the corrugations. Each of these four areas of particular note is discussed below and then a number of specific examples are described.

Fabrication Process

It is a particular advantage of the present invention that many different fabrication processes are suitable for use in manufacturing light emitting devices according to the invention.

Figure 1:
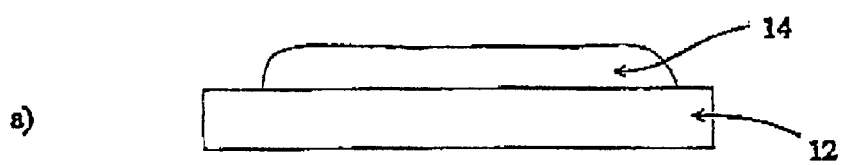
FIG. 1 illustrates a method of forming a substrate for use in light emitting device according to the present invention.
Figure 1:
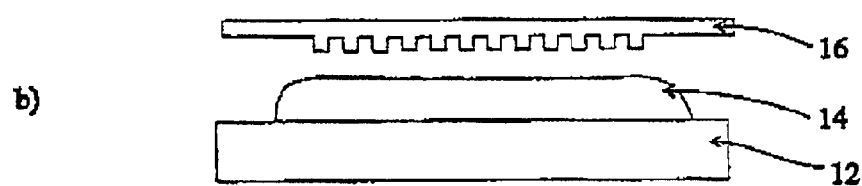
Figure 1:
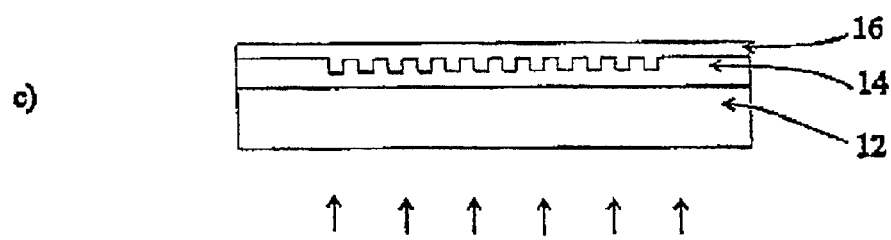
Figure 1:
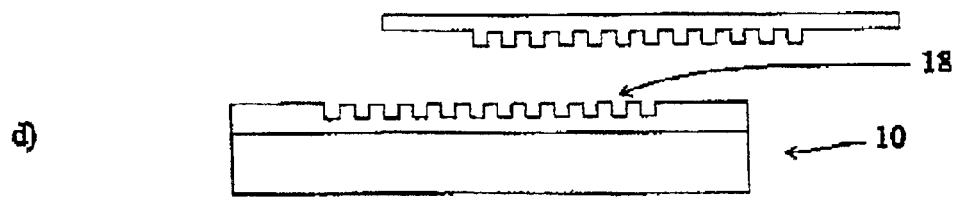

A method of forming a substrate for use in a light emitting device according to the present invention is illustrated in FIG. 1. In this arrangement, the substrate 10 comprises two components namely a transparent base 12 and a photo-polymerisation resin 14. As indicated in FIG. 1a, the photo-polymerisation resin 14 is applied to the upper surface of the base material 12. As indicated in FIG. 1b, the photo-polymerisation resin 14 covers an area at least as large as the area of a corrugated portion of a stamping mold 16. The stamping mold is pressed into the photo-polymerisation resin 14, which has the effect of flattening the photo-polymerisation resin 14 into a layer of uniform thickness (excess resin flows out from the edge). This procedure is preferably performed in a vacuum, so as to prevent bubble formation in the resin layer. As indicated in FIG. 1c, UV radiation is applied through the transparent base 12 so as to cure the resin 14. After the resin has been cured, the stamping mold is removed to leave the finished substrate 10 having a corrugated upper surface 18. The corrugated surface is used to form a corrugated active layer. The method is particularly suited to mass production.

The conductive polymer layer is formed by spin coating from solution. The surface of the conductive polymer layer also has corrugations. It is not exactly the same as the corrugation on the photo-polymerisation layer, but is slightly shallower and rounder. Instead of the conductive polymer layer, a hole-transporting layer is also applicable. Spin-coating is suitable for a polymer-type hole-sporting layer, evaporation is suitable for a small molecule type hole-transporting layer. For the light emitting layer, spin coating or evaporation is used depending on the type (polymer type or small molecule type). The cathode is formed by evaporation of metals.

An alternative to use of a substrate formed according to the method of FIG. 1 is to use an arrangement of a transparent substrate having a transparent electrode formed thereon with a conductive polymer film formed on the electrode, wherein the conductive polymer has a corrugated surface. A method of forming such an alternative component is illustrated in FIG. 2.

Figure 2:
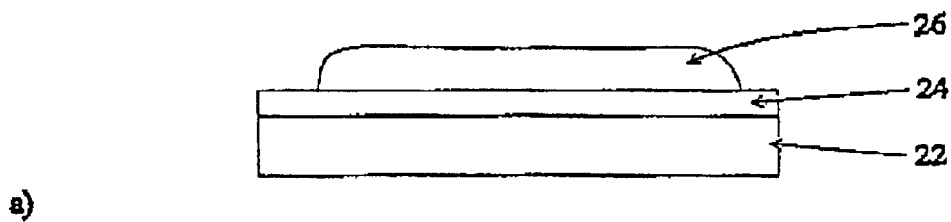
FIG. 2 illustrates another method of forming a substrate for use in a light emitting device according to the present invention.
Figure 2:
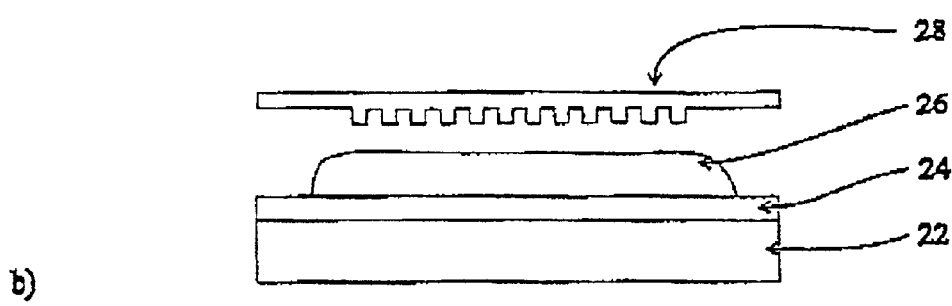
Figure 2:
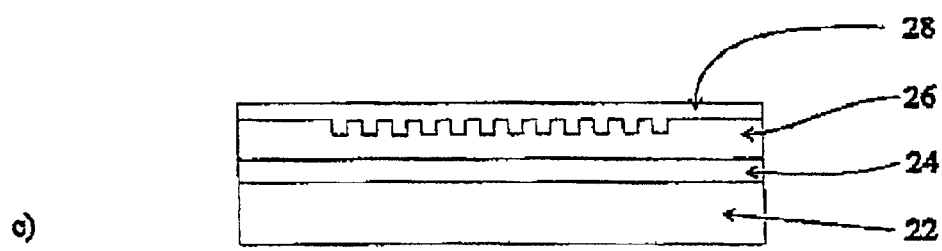
Figure 2:
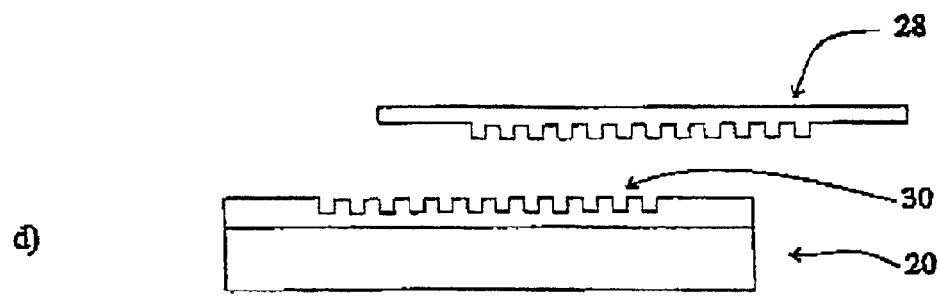

In FIG. 2, a component 20 is formed by providing a transparent substrate 22 having an Indium Tin Oxide (ITO) electrode 24 thereon. A solution 26 of conjugated polymer embedded in a transparent polymer matrix is then applied to the upper surface of the ITO electrode 24, as illustrated in FIG. 2a. As indicated in FIG. 2b, the solution 26 covers an area at least as large as the area of a corrugated portion of a stamping mold 28. The stamping mold is pressed firmly into the solution 26, which has the effect of flattening the solution into a layer of uniform thickness. The arrangement is then heated so as to dry and fix the solid content in the solution 26. After the solid content has been fixed, the stamping mold is removed to leave the finished component 20 having a corrugated upper surface 30.

It will be appreciated that whereas a metal (eg nickel) tamping mold can be used with the method of FIG. 1, the use of a metal stamping mold is not appropriate in the method of FIG. 2 wherein evaporation of solvent is required during the drying stage. Thus in the method of FIG. 2 use may be made of a polymer stamping mold which the solvent can penetrate Further, the method of FIG. 2 may involve the use of vacuum drying.

Figure 3:
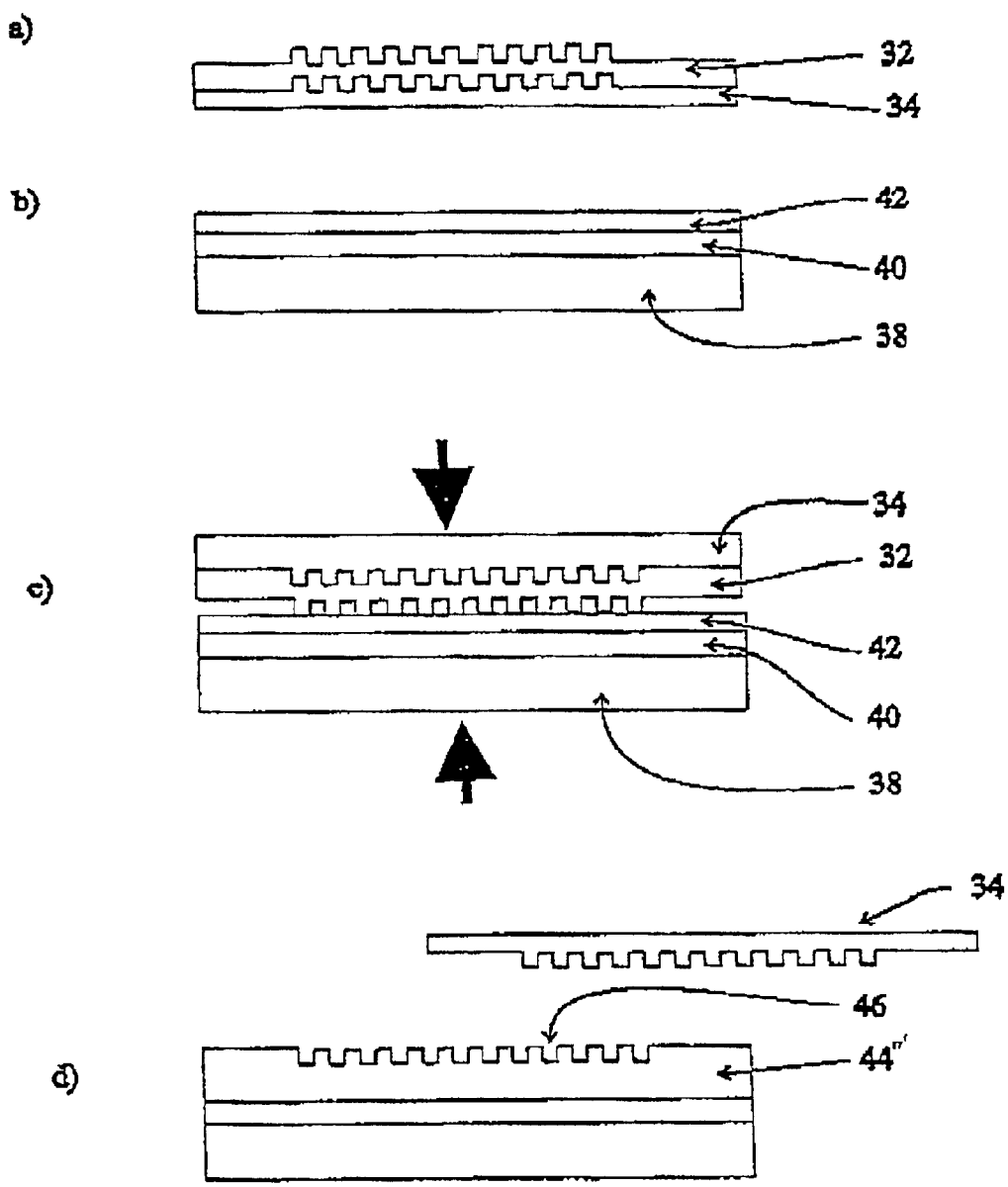
FIG. 3 illustrates a still further method of forming a substrate for use in a light emitting device according to the present invention.

An alternative method of forming the component 20 is illustrated in FIG. 3. The method of FIG. 3 involves the formation of two components which are laminated in to one component. Firstly a conductive polymer material 32 is applied by spin coating on to a stamping mold 34. As shown in FIG. 3a, the spin coated material 32 may have a corrugated upper surface which follows the corrugations of the stamping mold 34. A component consisting of a transparent substrate 38, an ITO electrode 40 and a layer of conductive polymer 42 is separately formed, as illustrated in FIG. 3b. The spin coated stamping mold 34 is inverted and positioned on top of the other component, so that the polymers 32 and 42 are in contact with each other. As indicated in FIG. 3c, pressure (and possibly also heat) is applied so as to laminate the two components together. The polymer 32 and 42 combine to form a single layer 44. Polymers have plastic characteristics especially at temperatures higher than the glass transition temperature. Polymer 32 and 42 do not have differences in their surface morphologies, but due to the plastic characteristics the polymers combine to form a single layer 44. Thereafter the stamping mold 34 is removed, as shown in FIG. 3d, so as to leave a single component having a transparent base 38, an ITO electrode 40 formed thereon and a conductive polymer layer 44, formed on the ITO and presenting a corrugated upper surface 46.

Figure 4:
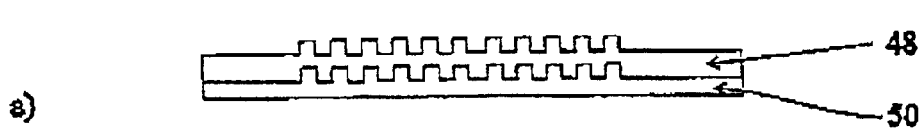
FIG. 4 illustrates yet another method of forming a substrate for use in a light emitting device according to the present invention.
Figure 4:
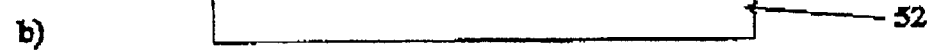
Figure 4:
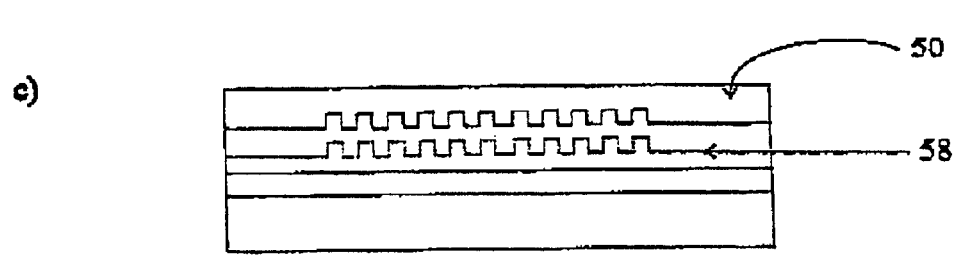

A still further method of forming a desired component is illustrated in FIG. 4. This method employs a combination of he polymer solution method of FIG. 2 and the lamination method of FIG. 3. Specifically, a conductive polymer material 48 is applied by spin coating to a stamping mold 50, as indicated in FIG. 4a. Separately, a transparent substrate 52 having an ITO electrode 54 thereon is prepared with a conductive polymer solution 56 applied on the surface of the ITO, as shown in FIG. 4b. Next, as shown in FIG. 4c, the spin coated mold 50 is inverted and pressed into the polymer solution 56. Heating is then applied so as to cause evaporation of the solvent and form a single layer 58 from the polymers 48 and 56. Even if the polymer used is not plastic enough for the lamination process, this method can form a single layer having a corrugated surface. As before, removal of the mold leaves a single component having a transparent base, an ITO electrode formed thereon and a conductive polymer layer, formed on the ITO and presenting a corrugated upper surface.

Figure 5:
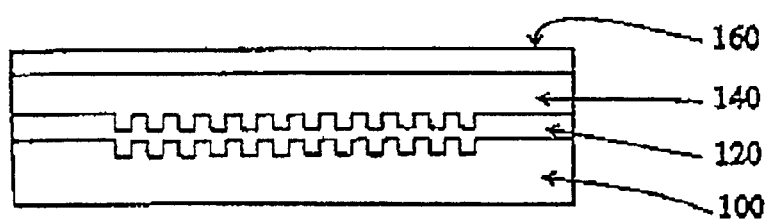
FIG. 5 illustrates a light emitting device using a substrate manufactured in accordance with the method illustrated in FIG. 1.
Figure 6:
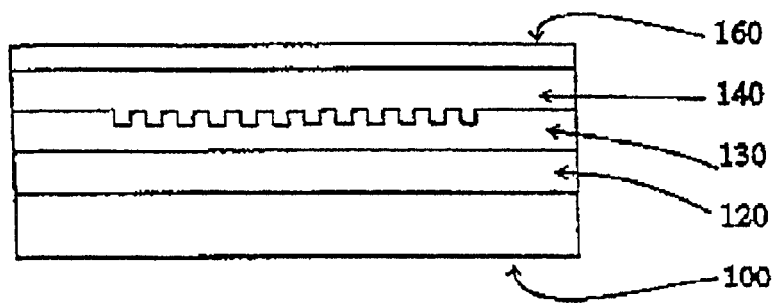
FIG. 6 illustrates a light emitting device using a substrate manufactured in accordance with the method illustrated in any of FIG. 2, 3 or 4.

FIG. 5 illustrates a light emitting device using a substrate manufactured in accordance with the method illustrated in FIG. 1. In FIG. 5, the transparent substrate is denoted by reference 100, the transparent ITO electrode is denoted by reference 120, the light emitting polymer is denoted by reference 140 and the metal electrode is denoted by reference 160. FIG. 6 illustrates a light emitting device using a substrate manufactured in accordance with the method illustrated in FIG. 2. The light emitting device manufactured in accordance with the method illustrated in FIG. 3, as well as that manufactured in accordance with the method of FIG. 4 is the same as shown in FIG. 6. The common reference numerals used in FIG. 6 and in FIG. 5 denote the same basic components, although in FIG. 6 neither the substrate nor the ITO are corrugated. In FIG. 6, it is the conductive polymer layer denoted by reference 130 which is corrugated and which imparts a corrugated surface to the active layer 140.

In use, a voltage is applied to drive the display device. Typically the voltage will be in the range 2V to 10V. A positive voltage is applied to the anode and the cathode can be corrected to ground.

The operative effect of the corrugated surface, whether in an embodiment formed according to the method of FIG. 1 or any of the methods according to FIGS. 2 to 4, will now be described. Specifically, the basic function of the corrugated surface is to couple the waveguide propagation mode with the radiative mode; so as to cause much of the generated light conventionally trapped in waveguide modes to be emitted from the device in the radiative mode (ie perpendicular to the active layer and through the transparent substrate). Within limits, the depth or amplitude of the corrugations controls the strength of the coupling between the modes, with a greater depth giving a higher coupling. Typically, the depth of the corrugations might be of the order of 50 nm—that is, similar to the depth of the active layer. Perhaps of more importance, however, is the period of the corrugations.

Period

It may be recognised that waveguide modes will be established across both the active material and the transparent ITO electrode and that waveguide modes may be established exclusively within the ITO layer. However, if the refractive index of the ITO is sufficiently lower than the refractive index of the active layer then waveguide modes exclusively within the ITO layer can in practice be ignored.

An actual device structure having many layers could support many waveguide modes, Because of the following reason, however, one needs to take into account only two wave guide modes. One is the waveguide mode supported in the light emitting layer, and the other is the mode supported over from the substrate to the light emitting layer, the typical refractive indices for the layers and the substrate are the following:—light emitting layer 1.8–1.9; conductive polymer layer (or hole transporting layer) 1.5–1.6; ITO layer 1.8–2.0; substrate (or phtotpolymerisation layer) 1.55. The light emitting layer, in general, has a high refractive index due to the fact that there is an absorption edge near the spectrum of the emission. The conductive polymer layer or hole-transporting layer has a lower refractive index man the light emitting layer. The conductive polymer is a narrow bandgap polymer, which has a rather low refractive index in the visible region. The hole-transporting layer should be transparent for the emission spectrum, resulting in a lower refractive index. The refractive index of the conductive polymer layer (or hole-transporting layer) is of the same order as that of the substrate. The refractive index of the conductive polymer layer (or hole-transporting layer) acts as a cladding layer which confines the light emitted from the light emitting layer within the light emitting layer. All the light passing through the conductive polymer layer (hole-transporting layer) does not enter the radiation mode, because the refractive index of air is the lowest refractive index in the system. Some light is reflected at the interface between the substrate and the air, and is confined within the structure from the light emitting layer, the conductor to the substrate.

Figure 7:
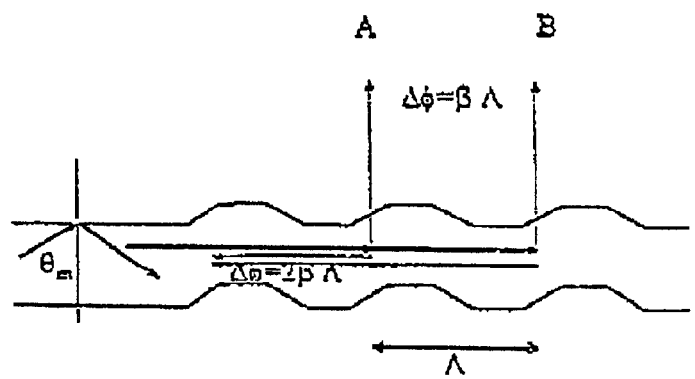
FIG. 7 illustrates various parameters associated with the pitch selection for the active layer.

FIG. 7 illustrates various parameters of the corrugated active layer which should be controlled so as to achieve the improved efficiency of the light emitting device according to the present invention. In this respect equations can be derived in terms of the various parameters, as follows.

The height (or depth) of the active layer is represented by h. Light propagating in a waveguide mode in the active layer is reflected from the upper and lower surfaces of the active layer, at an angle $\theta_m$ as indicated in FIG. 7 and where m is used to signify the mode number. On reflection from the surfaces there will be a phase change which is dependent upon the respective refractive index ratio between the active material and the material on either side thereof. These phase changes an denoted by the references $\phi_a$ and $\phi_b$, respectively for the upper and lower surfaces. Using $\lambda_o$ to indicate the desired output wavelength (in a vacuum), k to denote the propagation constant in a vacuum, $\beta$ to denote the propagation constant in the active material, $\Lambda$ to denote the pitch of the corrugations and n to denote an integer, the parameters are related by the equations:

$$2nhk \cos \theta_m - 2\phi_a - 2\phi_b = 2m\pi$$

$$\beta = nk \sin \theta_m$$

$$k = 2\pi/\lambda_o$$

Considering adjacent positions along the corrugated surface of the active layer, it will be apparent that a phase difference masts in the radiative emission from each of the adjacent positions. The radiative mode output will thus be chanced by ensuring that output from positions separated by the corrugation pitch length are in phase. Thus, it should be arranged that the phase difference, $\Delta\phi$, along the active layer is equal to the product of the pitch of the corrugations, $\Lambda$, and the propagation constant, $\beta$, within the active layer. For example, the two points of radiative emission indicated by arrows A and B in FIG. 7 should be in phase with each other—which is arranged by ensuring that $\Delta\phi = \beta\Lambda$. Thus, for a strong radiative mode emission:

$$\Delta\phi = \beta\Lambda = 2\pi v (v=1,2,3\ldots)$$

Hence:

$$\Lambda = v\lambda_o/n \sin \theta_m$$

That is; the pitch required to achieve a strong emission in the radiative mode for wavelength $\lambda_o$ is a relatively simple function of the angle $\theta_m$, which angle is determined by the depth and refractive index of the active layer and the mode number of the waveguide propagation which is being coupled.

Periodic Structure

Figure 8:
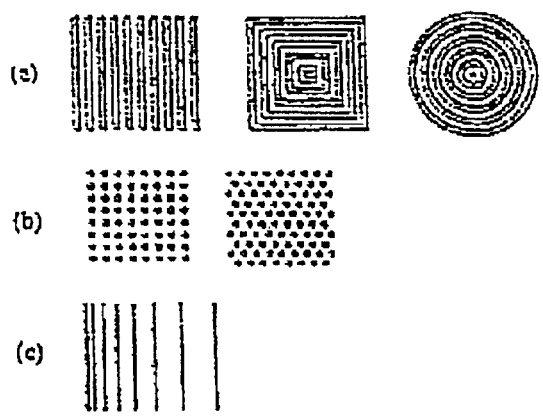
FIG. 8 illustrates various periodic structures which can be adopted in implementing the present invention.

It might be understood from FIGS. 1 to 4 that the corrugated surfaces have the form of a simple diffraction grating, that is as shown in the first of the three examples of FIG. 8(*a*). Although this may be the case, it is not limiting and other periodic patterns may be used. Other forms of what might be considered a one-dimensional periodic structure are illustrated as the other two examples in FIG. 8(*a*). Further, it is possible to use what might be considered as two or three dimensional periodic structures—for example having the formats indicated in FIG. 8(*b*). These are essentially photonic band gap structures. They stop propagation in certain directions at certain wavelengths. Of the two examples shown in FIG. 8(*b*), the off-set pattern (the second example,) is considered the most effective since all inter-dot distances are set to be equal to $\Lambda$. A further alternative is to use a so-called chirping grating, an ample of which is illustrated in FIG. 8(*c*). Usually the use of a grating results in a narrow spectrum. However, a chirping grating can be used when there is a requirement for high efficiency without the restriction of a narrow grating. This results in a broad spectrum. Efficiency is improved and emission from the device is more dependent upon the original emission properties of the material.

Optical Loss

In order to obtain a strong emission from a waveguide mode coupled with a radiation mode, it is necessary to minimise optical loss in the waveguide mode. The light in a waveguide travels very long distances compared to the light emitted directly in a radiation mode, even small absorption gives rise to attenuation of the field strength confined in the active layer, resulting in a small emission from a waveguide mode coupled with a radiation mode.

Considering light coming from a plane waveguide, which does not have a corrugated surface, and entering a corrugated waveguide; some part of the light is refracted in to the out-of-plane, and the other part is reflected within the waveguide. The intensities of the electric field become exponential. The intensity in the plain region is the sum of the incident light and the reflected light. The attenuation curve in the corrugated region can be described as $I=e^{-\gamma x}$, where $\gamma$ represents the coupling coefficient of the waveguide mode with the radiation made. The absorption in a waveguide is also described in the way namely, $I=e^{-\alpha x}$, where $\alpha$ is an absorption coefficient. In order to have a strong emission from the waveguide mode, the coupling coefficient $\gamma$ should be smaller than the absorption coefficient, preferably at least by a factor of ten.

The intrinsic absorption of active materials such as light emitting low molecules and light emitting conjugated polymers is low enough (eg less than 1000 $cm^{-1}$) in a transparent spectrum range compared to the coupling coefficient. Absorption in the waveguide mode arises from absorption in the active layer and also from absorption by the neighbouring layers. Absorption from the neighbouring layers arises since the energy of evanescent light existing in the neighbouring layers can be absorbed by the medium of the neighbouring layers. The cathode is made of metal, which has large absorption, so when the cathode is formed on the active layer, the absorption in the waveguide is determined by this metal. The order of the absorption is 1000 $cm^{-1}$, so the structure which has the cathode on the active layer can be used for this invention, but it is perhaps not ideal. An electron transforming cladding layer is preferably placed between the active layer and the cathode. The electron transforming cladding layer should be made of a material which has a high electron mobility and good matching of it's LUMO level to the work function of the cathode. In terms of the high mobility, a low molecular system might be more suitable for this purpose than conjugated polymers.

Figure 10:
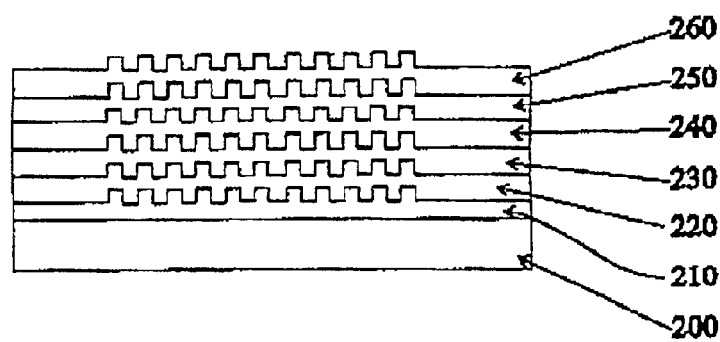
FIG. 10 illustrates a preferred structure for achieving low absorption in the waveguide

A preferred structure for achieving low absorption in the waveguide is illustrated in FIG. 10. The structure comprises a substrate 200 having a photo-polymerisation layer 210 thereon. The surface of the photo-polymerisation layer 210 opposite to that in contact with the substrate 200 is corrugated and a transparent electrode 220 is provided thereon. Next a conductive polymer layer or a hole transporting layer 230 is provided on the electrode 220 and then is located the light emitting layer 240. An electron transporting layer 250 is provided over the light emitting layer and at the top of the structure is an electrode 260. The corrugation of the layer 210 is followed by all of the subsequent layers, including the electrode 260. In this structure, the thickness of the electron transporting layer should be thicker than the penetration depth of evanescent light at the interface of the light emitting layer and the electron transporting layer.

Scattering in the active layer also increases optical loss. Scattered light could, however, be emitted from the device and thus scattering does not lower the efficiency. However, when the scattering is large, it is difficult to obtain the narrow spectrum output which should be expected from the device (according to the period of the corrugation pattern). Low molecular systems generally have a rough surface and many scattering points. Amorphous conjugated polymer is more suitable for the active layer because of it's low scattering characteristics.

Optical loss in the waveguide mode arises from absorption by the active layer and also from absorption by the neighbouring layers. Absorption by the neighbouring layers arises since reflection at the active layer boundaries is not reflection from a perfect surface but is in practice reflection across an interface depth. Further, domain ordering arises in the active layer, which is analogous to polycrystaline structures. That is, scattering occurs and this also causes optical loss in the waveguide mode.

The absorption coefficient, $\alpha$, of the active material is critical in reducing optical loss in the waveguide mode. Low molecular systems typically have absorption coefficients in the range of 500 $cm^{-1}$ to 1000 $cm^{-1}$.

The fabrication processes used with low molecular systems give rise to defects in the layer and a high degree of scattering results. In contrast polymer materials can be applied using ink-jet technology and low defect, low scattering active layers can thus be deposited.

The intensity of light loss in a material is dependent upon the absorption coefficient, $\alpha$, and distance, x, into the material in the following manner:

$$I=e^{-\alpha x}$$

Thus, a large absorption coefficient produces a sharp change in absorption with depth in to the material, eg within 10 $\mu$m. A layer thickness of 10 $\mu$m does not produce a large coupling and thus 10 $\mu$m can be considered to be a lower limit. An absorption coefficient of 100 $cm^{-1}$ results in a corresponding absorption depth of 100 $\mu$m, which is good enough to produce the desired coupling. Hence the use of a material such as a conjugated polymer is more desirable than the use of a low molecular system for the active layer. Further, there are of course many different polymer materials and some exhibit a polycrystaline type phase whereas others exhibit an amorphous phase. It is preferable to use an amorphous conjugated polymer for the active layer of a device according to the present invention. Polyflourine derivatives are particularly suitable materials which provide strong emission in a device according to the present invention.

Embodiments of the present invention preferably use light emitting materials which have an absorption coefficient of less than 1000 $cm^{-1}$, and more preferably of less than 500 $cm^{-1}$.

First Example

A first set of working examples was prepared, essentially following the method of FIG. 1. The examples used a glass substrate and a epoxy-photo-polymerisation resin. An electroformed nickel stamper, patterned by photo-lithography, was used to produce the corrugated surface. Stampers having a one dimensional periodic structure with pitch sizes of 300, 330, 360, 390 and 450 nm were used and the depth of the corrugations was set at 50 nm. The glass substrate was treated with a Silyl coupler to ensure sufficient adhesion of the resin layer. An ITO layer was deposited on the resin layer by RF sputtering with Ar and $O_2$ sputtering gas at 200° C. The thickness of the ITO layer was 120 nm. An active layer formed of F8BT, poly(9,9-dioctyylfluorene-co-2,1,3-benzothiadizole), was applied on to the ITO layer by spin coating. F8BT is an amorphous material presenting low optical loss. The active layer had a thickness of 140 nm and an absorption coefficient of less than 100 $cm^{-1}$. A metal electrode formed of Ca 100 nm/Al 300 nm was provided on the active layer by evaporation deposition.

The light emitting devices of this first set of working examples exhibited narrow linewidth outputs of high nativity and high efficiency. Typically the linewidth was 20 nm or less and the best results were obtained with corrugation pitches of 330 nm and 360 nm. These pitches satisfy the requirement for obtaining strong emission at the desired wavelength, which is in the range of the fluorescence spectrum of F8BT.

Figure 9:
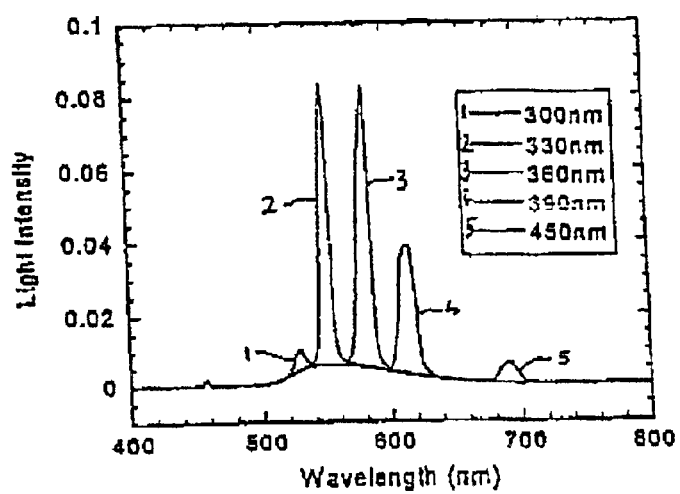
FIG. 9 illustrates the spectral output of one example of an embodiment according to the present invention.

The spectrum output achieved with this example is illustrated in FIG. 9.

Second Example

A second set of working examples was formed, essentially following the method of FIG. 2. These examples used a glass substrate provided with a flat ITO layer. A conductive polymer layer was formed using a blend, in aqueous solution, of PEDOT (poly-3,4-Ethlenedioxythiophene) and PSS (poly-stylene-sulfonic acid) in the ratios 1:5–1:100. The PSS is essentially used as a flexible matrix for the PEDOT material. PSS is a conventional polymer which is relatively easy to process for stamping and moulding. PEDOT is a conjugated polymer which is less easily processed than a non-conjugated polymer. It has a higher conductivity but a less plastic bulk property. The use of a thin layer reduces the importance of the conductivity and us the use of diluted PEDOT can be acceptable. PEDOT has a small absorption (the absorption coefficient is approximately 0.04 in the visible range), so it is possible to reduce the absorption by dilution with PSS, which is transparent in the visible range. This PEDOT does not form the core of the waveguide, but the tail of light distribution confined in the core could exist in this PEDOT layer. The loss of the waveguide can be reduced by applying this diluted PEDOT which has low absorption A polymer stamper mould (formed using a nickel stamper) was used to corrugate the surface of the conductive polymer layer. That is, the polymer solution was applied over the ITO layer and the polymer stamper mould applied to the solution and left to dry at 80° C. for 24 hours. The mould was then removed and an active layer applied by spin coating. The active layer was formed of F8BT, poly(9,9-dioctyylfluorene-co-2,1,3-benzothiadizole) to a thickness of 140 nm. The absorption coefficient was less than 100 $cm^{-1}$. A metal electrode formed of Ca 100 nm/Al 300 nm was provided on the active layer by evaporation deposition.

The light emitting devices of the second set of working examples exhibited output characteristics very similar to those of the first set of working examples.

A first set of modified examples of the second set of working examples were made, essentially using the method of FIG. 3. That is, the solution of conductive polymer was spin-coated on to a nickel stamper and on to the ITO layer. The two components thus formed were pressed together in a vacuum at 200° C. for 5 minutes and the nickel stamper was then pulled off. Similar results were obtained as with the previous examples.

A second set of modified examples of the second set of working examples were made, essentially using the method of FIG. 4. That is, the solution of conductive polymer was spin-coated on to a plastic mould and on to the ITO layer. The two components were joined together and dried at 80° C. in a vacuum for 24 hours. The plastic mould was then removed. Again, similar results were obtained as with the previous examples.

Third Example

A third set of working examples was made, essentially following the method and materials used for the first set of working examples but in this case the stamper was embossed with an array of dots. That is, the periodic structures were of the types illustrated in FIG. 8(b). The third set of working examples exhibited highly directional outputs and the emission peaks were as much as 2.5 times as high as those of the first set of working examples. Whereas the one-dimensional periodic structure of the first set of working examples generates a "line" output directivity, the two-dimensional periodic structure of the third set of working examples generates a "column" output directivity.

Fourth Example

A fourth set of working examples was made, essentially following the method and materials used for the first set of working examples but in this case the stamper was embossed with a "chirping" grating. That is, the periodic structures were of the type illustrated in FIG. 8(c). The fourth set of working examples exhibited high efficiency and broad spectrum outputs.

Fifth Example

The fifth set of examples essentially follow the method and materials used for the first set of working examples but in this case the stamper provided gratings of different periods, or different design, on the same substrate. Thus each area having a respective one of the gratings each enhanced a respective wavelength and the examples thus provided multi-colour outputs. The high directivity of the outputs reduces the usefulness of the devices for display devices such as those conventionally implemented with Liquid Crystal Display panels.

However, the high directivity of the output renders the devices particularly suitable for various other applications such a projection display apparatus.

What is claimed is:

1. A light emitting device comprising:
   a substrate;
   a transparent electrode formed on said substrate;
   a layer of light emitting material provided over the transparent electrode and having at least one corrugated surface;
   a further electrode formed over the light emitting material; and
   a conductive polymer layer formed over the transparent electrode, the conductive polymer layer having a corrugated surface opposite to a surface facing the transparent electrode, and the light emitting material being in contact with said corrugated surface of the conductive polymer layer.

2. A light emitting device as claimed in claim 1, wherein the light emitting material is an organic material.

3. A light emitting device as claimed in claim 1, wherein the substrate has a corrugated surface.

4. A light emitting device as claimed in claim 1, wherein the light emitting material has an absorption coefficient of less than 1000 $cm^{-1}$.

5. A light emitting device as claimed in claim 1, wherein the light emitting material comprises a conjugated polymer.

6. A light emitting device as claimed in claim 1, wherein the light emitting material comprises a polyflourine derivative.

7. A light emitting device as claimed in claim 1, wherein the corrugated surface has a pitch Λ according to the equation:

$$\Lambda = v\lambda_0/n \sin \theta_m$$

in which angle $\theta_m$ is the angle of reflection from the upper and lower surfaces of the layer of light emitting material of light propagating in a waveguide mode m in the light emitting material, $\lambda_0$ is the output wavelength, and n and v are integers.

8. A light emitting device as claimed in claim 1, wherein the pitch of the corrugated surface is in the range 300 to 450 nm.

9. A light emitting device as claimed in claim 1, wherein the corrugated surface has a pitch only in a first dimension.

10. A light emitting device as claimed in claim 1, wherein the corrugated surface has a pitch in a first and a second dimension.

11. A light emitting device as claimed in claim 1, wherein the corrugated surface has a three-dimensional periodic structure.

12. A light emitting device as claimed in claim 1, wherein the corrugated surface has the structure of a chirping grating.

13. A light emitting device as claimed in claim 1, wherein the layer of light emitting material has a plurality of regions each of which has a corrugated surface with a respectively different pitch.

14. A method of manufacturing a light emitting device comprising the steps of:
providing a substrate;
forming a transparent electrode on said substrate;
providing a layer of light emitting material over the transparent electrode;
arranging for the light emitting surface to have at least one corrugated surface;
forming a further electrode over the light emitting material; and
forming a conductive polymer layer over the transparent electrode, wherein the step of arranging for the light emitting surface to have at least one corrugated surface includes providing a corrugated surface on the conductive polymer layer on a surface of the conductive polymer layer opposite to a surface facing the transparent electrode, and wherein the light emitting material is provided in contact with the corrugated surface of the conductive polymer layer.

15. A method of manufacturing a light emitting device as claimed in claim 14, wherein the step or arranging for the light emitting surface to have at least one corrugated surface includes providing a corrugated surface on the substrate.

16. A method of manufacturing a light emitting device as claimed in claim 15, comprising the steps of:
providing the substrate with a photo-setting resin;
forming the corrugated surface on the substrate by shaping the resin using a mold; and
setting the resin by illuminating it with radiation.

17. A method of manufacturing a light emitting device as claimed in claim 14, comprising the steps of:
forming the corrugated surface on the conductive polymer layer by shaping the layer with a polymer mold; and
setting the layer by applying heat.

18. A method of manufacturing a light emitting device as claimed in claim 14, comprising the step of providing a corrugated surface on the conductive polymer layer comprising:
spin coating a conductive polymer material on to the transparent electrode;
spin coating a conductive polymer material on to the corrugated surface of a mold;
positioning the spin coated mold on the conductive polymer layer provided on the transparent electrode so as to sandwich the two conductive polymer layers together; and
subsequently removing the mold.

19. A light emitting device comprising:
a substrate;
a transparent electrode formed on said substrate;
a layer of light emitting material provided over the transparent electrode and having at least one corrugated surface; and
a further electrode formed over the light emitting material, wherein the light emitting material comprises a polyflourine derivative,
wherein the at least one corrugated surface has a pitch Λ according to the equation:

$$\Lambda = v\lambda_0/n \sin \theta_m$$

in which angle $\theta_m$ is the angle of reflection from the upper and lower surfaces of the layer of light emitting material of light propagating in a waveguide mode m in the light emitting material, $\lambda_0$ is the output wavelength, and n and v are integers.

20. A light emitting device as claimed in claim 19, wherein the substrate has a corrugated surface.

21. A light emitting device as claimed in claim 19, wherein the light emitting material has an absorption coefficient of less than 1000 $cm^{-1}$.

22. A light emitting device as claimed in claim 19, wherein the pitch of the corrugated surface is in the range 300 to 450 nm.

23. A light emitting device as claimed in claim 19, wherein the pitch of the corrugated surface is only in a first dimension.

24. A light emitting device as claimed in claim 19, wherein the pitch of the corrugated surface is in a first and a second dimension.

25. A light emitting device as claimed in claim 19, wherein the corrugated surface has a three-dimensional periodic structure.

26. A light emitting device as claimed in claim 19, wherein the layer of light emitting material has a plurality of regions each of which has a corrugated surface with a respectively different pitch.

27. A light emitting device comprising:
a substrate;
a transparent electrode formed on said substrate;
a layer of light emitting material provided over the transparent electrode and having at least one corrugated surface, wherein the at least one corrugated surface has the structure of a chirping grating; and
a further electrode formed over the light emitting material, wherein the light emitting material comprises a polyflourine derivative.

28. A light emitting device as claimed in claim 27, wherein the substrate has a corrugated surface.

29. A light emitting device as claimed in claim 27, wherein the light emitting material has an absorption coefficient of less than 1000 cm$^{-1}$.

30. A light emitting device as claimed in claim 27, wherein a pitch of the corrugated surface is in the range 300 to 450 nm.

31. A light emitting device as claimed in claim 27, wherein a pitch of the corrugated surface is only in a first dimension.

32. A light emitting device as claimed in claim 27, wherein a pitch of the corrugated surface is in a first and a second dimension.

33. A light emitting device as claimed in claim 27, wherein the corrugated surface has a three-dimensional periodic structure.

34. A light emitting device as claimed in claim 27, wherein the layer of light emitting material has a plurality of regions each of which has a corrugated surface with a respectively different pitch.

35. A light emitting device comprising:
   a substrate;
   a transparent electrode formed on said substrate;
   a layer of light emitting material provided over the transparent electrode and having at least one corrugated surface;
   a further electrode formed over the light emitting material; and wherein the corrugated surface has a pitch $\Lambda$ according to the equation:

$$\Lambda = v\lambda_0/n \sin \theta_m$$

in which angle $\theta_m$ is the angle of reflection from the upper and lower surfaces of the layer of light emitting material of light propagating in a waveguide mode m in the light emitting material, $\lambda_0$ is the output wavelength, and n and v are integers.

36. A light emitting device as claimed in claim 35, wherein the light emitting material is an organic material.

37. A light emitting device as claimed in claim 35, wherein the substrate has a corrugated surface.

38. A light emitting device as claimed in claim 35, wherein the light emitting material has an absorption coefficient of less than 1000 cm$^{-1}$.

39. A light emitting device as claimed in claim 35, wherein the light emitting material comprises a conjugated polymer.

40. A light emitting device as claimed in claim 35, wherein the pitch of the corrugated surface is in the range 300 to 450 nm.

41. A light emitting device as claimed in claim 35, wherein the corrugated surface has a pitch only in a first dimension.

42. A light emitting device as claimed in claim 35, wherein the corrugated surface has a pitch in a first and a second dimension.

43. A light emitting device as claimed in claim 35, wherein the corrugated surface has a three-dimensional periodic structure.

44. A light emitting device as claimed in claim 35, wherein the corrugated surface has the structure of a chirping grating.

45. A light emitting device as claimed in claim 35, wherein the layer of light emitting material has a plurality of regions each of which has a corrugated surface with a respectively different pitch.

46. A light emitting device comprising:
   a substrate;
   a transparent electrode formed on said substrate;
   a layer of light emitting material provided over the transparent electrode and having at least one corrugated surface; and
   a further electrode formed over the light emitting material, wherein the corrugated surface has the structure of a chirping grating.

47. A light emitting device as claimed in claim 46, wherein the light emitting material is an organic material.

48. A light emitting device as claimed in claim 46, wherein the substrate has a corrugated surface.

49. A light emitting device as claimed in claim 46, wherein the light emitting material has an absorption coefficient of less than 1000 cm$^{-1}$.

50. A light emitting device as claimed in claim 46, wherein the light emitting material comprises a conjugated polymer.

* * * * *